(12) United States Patent
Troughton (10) Patent No.: US 12,154,961 B1
(45) Date of Patent: Nov. 26, 2024

(54) OHMIC CONTACTS FOR A HIGH-ELECTRON-MOBILITY TRANSISTOR

(71) Applicant: GlobalFoundries U.S. Inc., Malta, NY (US)

(72) Inventor: Samuel Troughton, Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/742,692

(22) Filed: Jun. 13, 2024

(51) Int. Cl.
| | | |
|---|---|---|
| *H01L 29/778* | (2006.01) | |
| *H01L 29/20* | (2006.01) | |
| *H01L 29/40* | (2006.01) | |
| *H01L 29/45* | (2006.01) | |
| *H01L 29/66* | (2006.01) | |

(52) U.S. Cl.
CPC ........ *H01L 29/452* (2013.01); *H01L 29/2003* (2013.01); *H01L 29/401* (2013.01); *H01L 29/66462* (2013.01); *H01L 29/7786* (2013.01)

(58) Field of Classification Search
CPC . H01L 29/452; H01L 29/2003; H01L 29/401; H01L 29/66462; H01L 29/7786
See application file for complete search history.

(56) References Cited

U.S. PATENT DOCUMENTS

| | | | |
|---|---|---|---|
| 7,084,423 B2 | 8/2006 | Grupp et al. | |
| 9,276,077 B2 * | 3/2016 | Basu | H01L 29/66431 |
| 9,634,107 B2 | 4/2017 | De Jaeger et al. | |
| 2023/0268431 A1 * | 8/2023 | Hsueh | H01L 23/5283 |
| | | | 257/183 |

OTHER PUBLICATIONS

Li, Pengfei et al., "Optimization of Oxygen Plasma Treatment on Ohmic Contact for AlGaN/GaN HEMTs on High-Resistivity Si Substrate." Electronics 10, No. 7: 855. (2021) https://doi.org/10.3390/electronics10070855.
Ho, Jin-Kuo et al., "Low-resistance ohmic contacts to p-type GaN achieved by the oxidation of Ni/Au films." Journal of Applied Physics, vol. 86, Issue 8 (Oct. 15, 1999); pp. 4491-4497; https://doi.org/10.1063/1.371392.

\* cited by examiner

*Primary Examiner* — David Vu
(74) *Attorney, Agent, or Firm* — Thompson Hine LLP; Anthony Canale (57) ABSTRACT

Structures including an ohmic contact for a high-electron-mobility transistor and methods of forming such structures. The structure comprises a layer stack on a substrate and a device structure including an ohmic contact. The layer stack includes a plurality of semiconductor layers each comprising a compound semiconductor material. The ohmic contact includes a metal layer in a contacting relationship with a portion of at least one of the semiconductor layers of the layer stack and a region comprising oxygen atoms, and the metal layer is positioned between the region and the portion of the at least one of the semiconductor layers of the layer stack.

20 Claims, 4 Drawing Sheets

OHMIC CONTACTS FOR A HIGH-ELECTRON-MOBILITY TRANSISTOR

STATEMENT REGARDING FEDERALLY SPONSORED RESEARCH OR DEVELOPMENT

This invention was made with government support under HQ0727790700 awarded by the Defense Microelectronics Activity. The government has certain rights in the invention.

BACKGROUND

The disclosure relates to semiconductor device fabrication and integrated circuits and, more specifically, to structures including an ohmic contact for a high-electron-mobility transistor and methods of forming such structures.

Compound semiconductors are characterized by material properties, such as a carrier mobility that is greater than the carrier mobility of silicon and a wider band gap than silicon, that can be exploited. Compound semiconductors may include, for example, Group III elements (e.g., aluminum, gallium, and/or indium) and Group V elements (e.g., nitrogen, phosphorus, arsenic, and/or antimony) combined with the Group III elements.

High-electron-mobility transistors are compound semiconductor-based devices that may be deployed in certain integrated circuit applications, such as high-voltage power electronics. A high-electron-mobility transistor may include a heterojunction between crystalline compound semiconductor materials having different band gaps, such as a heterojunction between binary gallium nitride and trinary aluminum-gallium nitride. During operation, a two-dimensional electron gas is formed near an interface at the heterojunction and defines the channel of the high-electron-mobility transistor.

A high-electron-mobility transistor may include ohmic contacts that are coupled to the two-dimensional electron gas. The ohmic contact resistance to the two-dimensional electron gas is a relevant parameter governing device performance. An elevated ohmic contact resistance may degrade device performance and, if the ohmic contact resistance falls outside of an acceptance criterion, may result in yield loss.

Improved structures including an ohmic contact for a high-electron-mobility transistor and methods of forming such structures are needed.

SUMMARY

In an embodiment of the invention, a structure comprises a layer stack on a substrate. The layer stack includes a plurality of semiconductor layers each comprising a compound semiconductor material. The structure further comprises a device structure including an ohmic contact. The ohmic contact includes a metal layer in a contacting relationship with a portion of at least one of the semiconductor layers of the layer stack and a region comprising oxygen atoms, and the metal layer is positioned between the region and the portion of the at least one of the semiconductor layers of the layer stack.

In an embodiment of the invention, a structure for forming an ohmic contact is provided. The structure comprises a first layer stack on the substrate and a second layer stack on the first layer stack. The first layer stack includes a plurality of semiconductor layers each comprising a compound semiconductor material, and the second layer stack includes a layer comprising silicon and oxygen adjacent to the first layer stack.

In an embodiment of the invention, a method comprises forming a layer stack on a substrate and forming an ohmic contact of a device structure. The layer stack includes a plurality of semiconductor layers each comprising a compound semiconductor material. The ohmic contact includes a metal layer in a contacting relationship with a portion of at least one of the semiconductor layers of the layer stack and a region comprising oxygen atoms, and the metal layer is positioned between the region and the portion of the at least one of the semiconductor layers of the layer stack.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
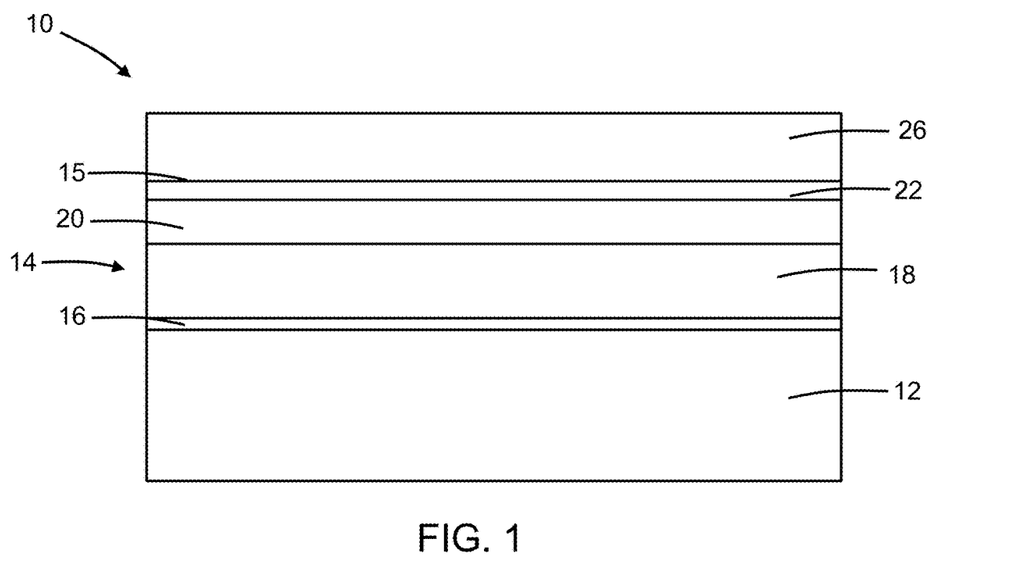
FIG. 1 is a cross-sectional view of a structure at an initial fabrication stage of a processing method in accordance with embodiments of the invention.

With reference to FIG. 1 and in accordance with embodiments of the invention, a structure 10 for a high-electron-mobility transistor may include a layer stack 14 that is formed on the top surface of a substrate 12. The substrate 12 may be comprised of a single-crystal semiconductor material, such as single-crystal silicon. The substrate 12 may be a bulk substrate that contains a single-crystal semiconductor material, such as single-crystal silicon. In an embodiment, the single-crystal semiconductor material of the substrate 12 may have a diamond crystal lattice structure with a <111> crystal orientation as specified by Miller indices. In an embodiment, the substrate 12 may contain single-crystal silicon with a diamond crystal lattice structure having a <111> crystal orientation. For a substrate 12 having a <111> crystal orientation, the (111) crystallographic plane is parallel to the top surface of the substrate 12, and the [111] crystallographic direction is normal to the (111) plane. In an embodiment, the substrate 12 may be fully comprised of semiconductor material with a <111> crystal orientation. The substrate 12 may be doped to have, for example, p-type conductivity. The substrate 12 may be heavily doped with a p-type dopant, such as boron, such that the resistivity is less than 100 ohm-cm. In alternative embodiments, the substrate 12 may be a different type of substrate, such as a sapphire substrate, an engineered substrate, a silicon-on-insulator substrate, a silicon carbide substrate, etc.

The layer stack 14 may include a seed layer 16, a buffer layer 18, a channel layer 20, and a donor layer 22 each containing one or more compound semiconductor materials. The seed layer 16 provides a thin nucleation layer for the growth of the buffer layer 18 and may be comprised of, for example, aluminum nitride. The layers 16, 18, 20, 22 may be serially deposited using an epitaxial growth process, such as metalorganic chemical vapor deposition, vapor phase epitaxy, or molecular beam epitaxy, to form the layer stack 14. The layer stack 14 may have a thickness, for example, on the order of five (5) micrometers.

The layers 16, 18, 20, 22 of the layer stack 14 may each have a crystal structure that is single crystal or, alternatively, a crystal structure that is substantially single crystal with varying levels of crystalline defectivity present. The buffer layer 18 may be comprised of one or more binary or ternary III-V compound semiconductor materials, such as gallium nitride, aluminum nitride, aluminum gallium nitride, or a layered combination of these materials, and the buffer layer 18 is tailored in terms of material composition, doping, layering, and/or layer thickness to accommodate lattice mismatch, thermal property differences, and mechanical property differences between the material of the substrate 12 and the material of the channel layer 20. The channel layer 20, which is disposed on the buffer layer 18, may be comprised of a binary or ternary III-V compound semiconductor material. The donor layer 22, which is disposed over the channel layer 20, may contain a ternary III-V compound semiconductor, such as aluminum gallium nitride, that provides an heterogenous interface with the channel layer 20 of different composition. The channel layer 20 may include a sublayer comprised of undoped gallium nitride adjacent to the donor layer 22 and a sublayer comprised of gallium nitride doped with either carbon or iron adjacent to the buffer layer 18, and an optional barrier layer comprised of, for example, aluminum nitride may be located between the channel layer 20 and the donor layer 22. During operation of the high-electron-mobility transistor, a two-dimensional electron gas is formed near an interface at the heterojunction between the channel layer 20 and the donor layer 22.

A gate layer 26 containing one or more III-V compound semiconductor materials may be formed on the donor layer 22 at the top surface 15 of the layer stack 14. The gate layer 26 may be comprised of a doped III-V compound semiconductor material, such as p-type gallium nitride.

Figure 2:
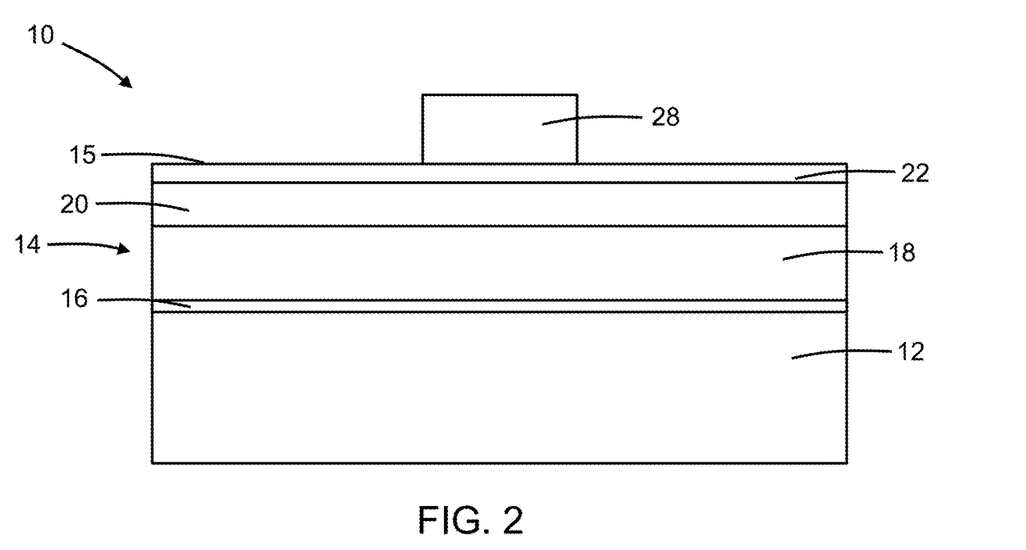
FIG. 2 is a cross-sectional view of the structure at a fabrication stage subsequent to FIG. 1.

With reference to FIG. 2 in which like reference numerals refer to like features in FIG. 1 and at a subsequent fabrication stage, the gate layer 26 may be patterned by lithography and etching processes to define a gate 28 of an exemplary compound-semiconductor-based device that is positioned on the top surface 15 of the layer stack 14. A gate electrode (not shown) comprised of, for example, titanium nitride may be positioned on a top surface of the gate 28. In an alternative embodiment, the gate 28 may be comprised of one or more metals, and a gate dielectric layer may be positioned between the gate 28 and the top surface 15 of the layer stack 14. In an alternative embodiment, the gate 28 may be positioned in a recess formed in the top surface 15 of the layer stack 14.

Figure 3:
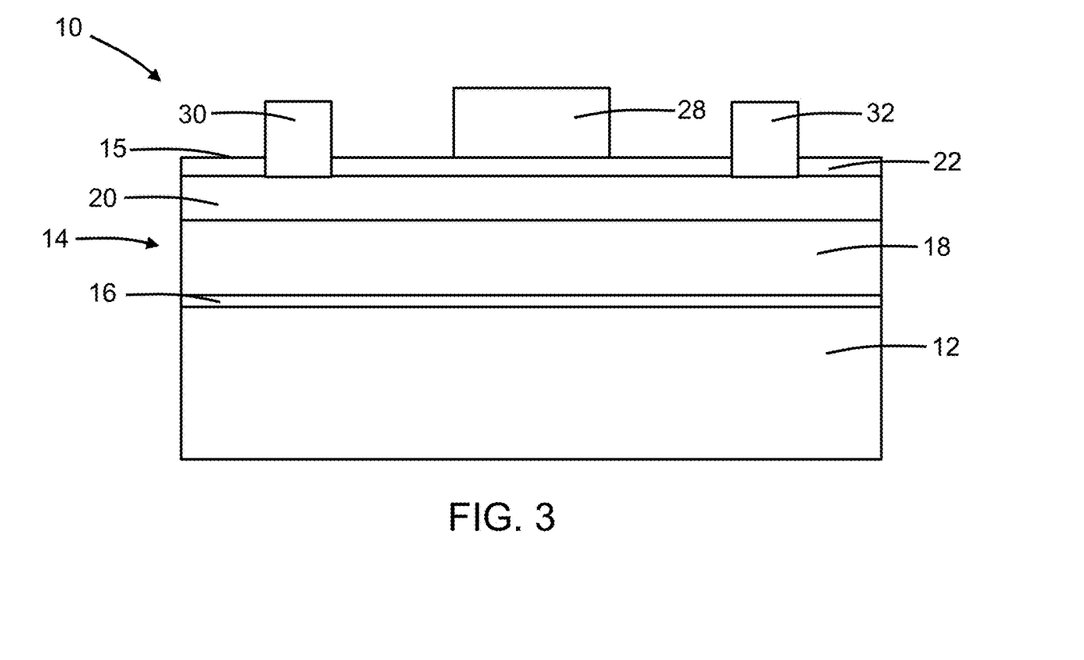
FIG. 3 is a cross-sectional view of the structure at a fabrication stage subsequent to FIG. 2.
Figure 3A:
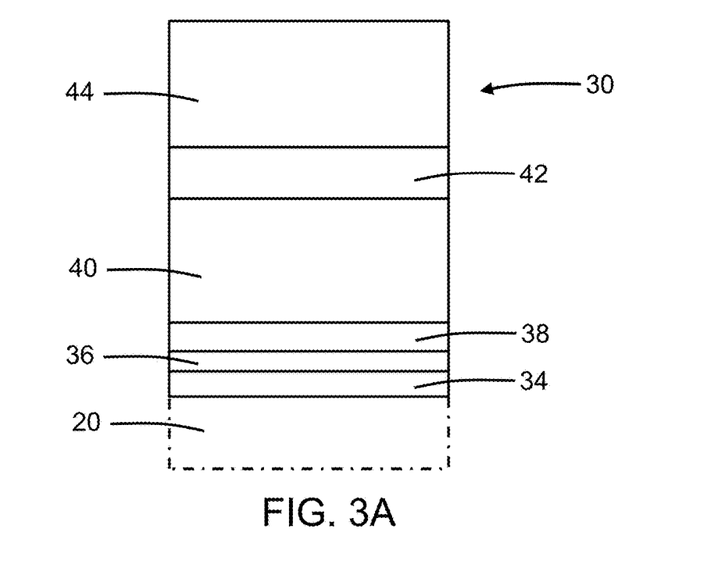
FIGS. 3A, 3B are enlarged cross-sectional views of the ohmic contacts in FIG. 3.
Figure 3B:
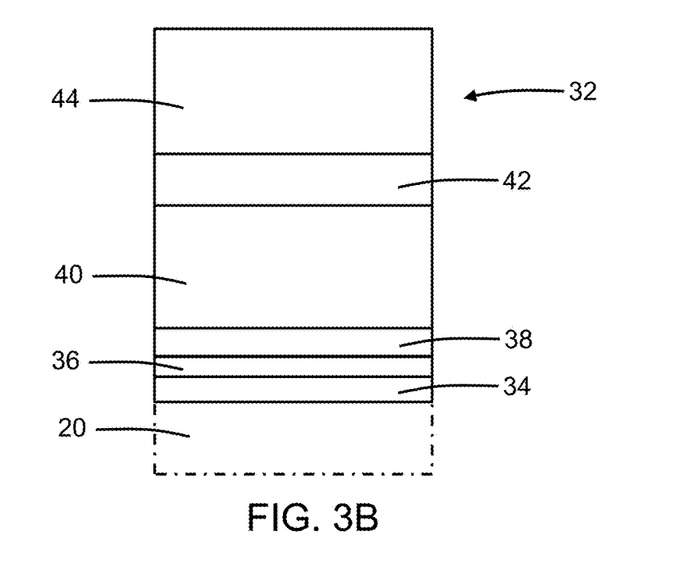

With reference to FIGS. 3, 3A, 3B in which like reference numerals refer to like features in FIG. 2 and at a subsequent fabrication stage, the structure 10 for the high-electron-mobility transistor may further include a source ohmic contact 30 and a drain ohmic contact 32 that are formed on different portions of the layer stack 14. The gate 28 is positioned in a lateral direction between the source ohmic contact 30 and the drain ohmic contact 32. In an embodiment, the source ohmic contact 30 and the drain ohmic contact 32 may be in a directly contacting relationship with the channel layer 20. In an embodiment, the source ohmic contact 30 and drain ohmic contact 32 may be formed in respective recesses that penetrate through the donor layer 22 to the channel layer 20 in order to provide the directly contacting relationship. In an alternative embodiment, the source ohmic contact 30 and the drain ohmic contact 32 may be formed in respective recesses that penetrate only partially through the donor layer 22 such that direct contact is absent. Surfaces exposed by the recesses may be cleaned before forming the ohmic contacts 30, 32.

The source ohmic contact 30 and the drain ohmic contact 32 each include multiple layers 38, 40, 42, 44 that are disposed in a layer stack on a pair of layers 34, 36. The layers 34, 36 are also disposed in a layer stack with the layer 34 adjacent to the channel layer 20. In an embodiment, the layer 34 may be positioned between the layer 36 and the channel layer 20. In an embodiment, the layer 34 may be disposed in a directly contacting relationship with a portion of the channel layer 20. In an alternative embodiment, the layer 34 may be spaced from the channel layer 20 by a partial thickness of the donor layer 22 such that direct contact is absent.

The layer 34 may be comprised of silicon. In an embodiment, the layer 34 may be exclusively comprised of silicon. In an embodiment, the layer 34 may be comprised of amorphous silicon deposited by chemical vapor deposition. In an embodiment, the layer 34 may have a thickness in a range of about two (2) nanometers to about thirty (30) nanometers.

The layer 36 may be comprised of a different material than layer 34. In an embodiment, the layer 36 may be comprised of silicon and oxygen. In an embodiment, the layer 36 may be exclusively comprised of silicon and oxygen. In an embodiment, the layer 36 may be comprised of silicon dioxide. In an embodiment, the layer 36 may be formed by oxidizing the material of an upper portion of the layer 34 by, for example, an oxygen plasma treatment, after deposition, such that oxygen atoms are introduced. In an alternative embodiment, a thermal oxidation process may be used to oxidize the material of the layer 34 to form the layer 36. In an alternative embodiment, a wet chemical oxidation process may be used to oxidize the material of the layer 34 to form the layer 36. In an alternative embodiment, the layer 36 may be deposited on the layer 34 by a given deposition technique, such as atomic layer deposition, chemical vapor deposition, or physical vapor deposition.

The layer 38 may be comprised of a metal, such as titanium, deposited by physical vapor deposition and, in an embodiment, the layer 38 may have a thickness equal to about five (5) nanometers. In an embodiment, the layer 38 may be exclusively comprised of titanium. The layer 40 may be comprised of a metal, such as aluminum, deposited by physical vapor deposition and, in an embodiment, the layer 40 may have a thickness equal to about one hundred (100) nanometers. In an embodiment, the layer 40 may be exclusively comprised of aluminum. The layer 42 may be comprised of a metal, such as titanium, deposited by physical vapor deposition and, in an embodiment, the layer 42 may have a thickness equal to about twenty (20) nanometers. In an embodiment, the layer 42 may be exclusively comprised of titanium. The layer 44 may be comprised of titanium nitride deposited by physical vapor deposition and, in an embodiment, the layer 44 may have a thickness equal to about fifty (50) nanometers.

In an alternative embodiment, the layer 36 may be moved upward in the layer stack, and further away, from the channel layer 20, such as being positioned between the layer 38 and the layer 40. In an alternative embodiment, the layer 36 may be comprised of silicon and nitrogen, and the nitrogen atoms may be introduced by nitridation. In an alternative embodiment, the layer 36 may be comprised of silicon and carbon, and the carbon atoms may be introduced by carbonizing.

Figure 4:
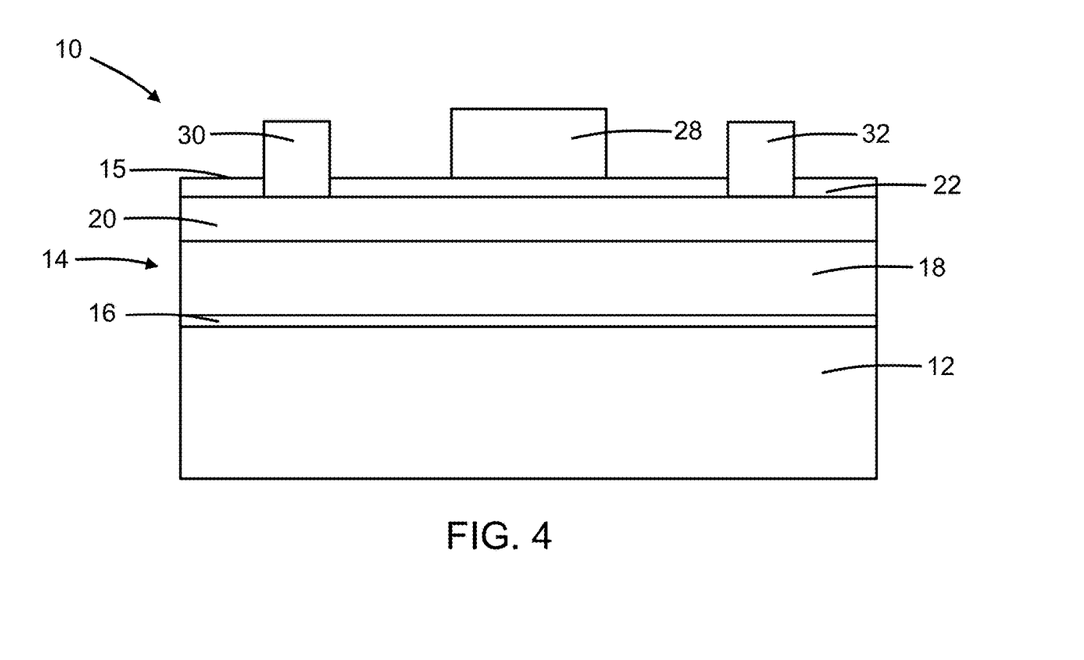
FIG. 4 is a cross-sectional view of the structure at a fabrication stage subsequent to FIG. 3.
Figure 4A:
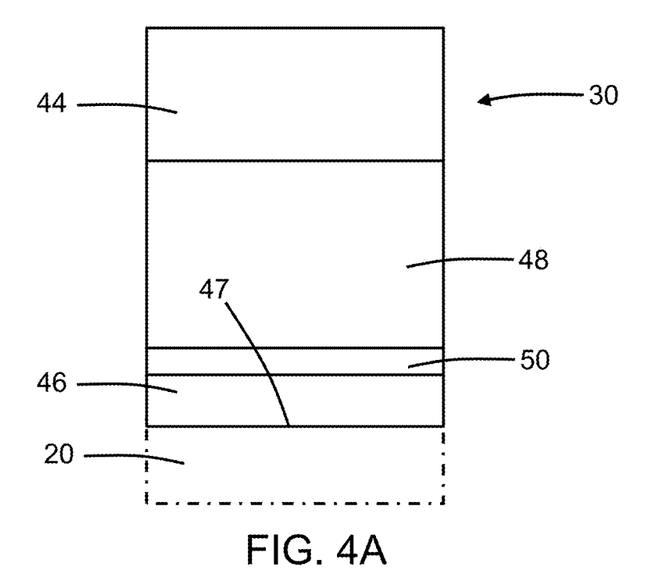
FIGS. 4A, 4B are enlarged cross-sectional views of the ohmic contacts in FIG. 4.
Figure 4B:
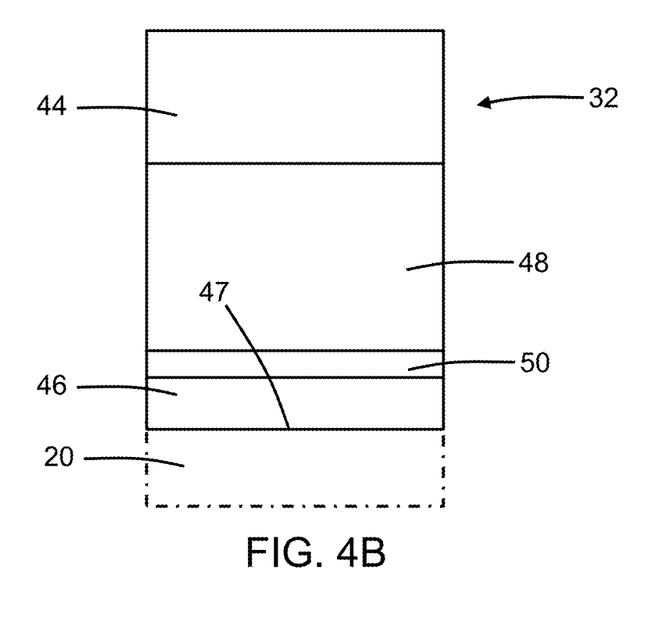

With reference to FIGS. 4, 4A, 4B in which like reference numerals refer to like features in FIGS. 3, 3A, 3B and at a subsequent fabrication stage, an anneal, such as a rapid thermal anneal, may be performed that modifies the layers 34, 36, 38, 40, 42 of the source ohmic contact 30 and the layers 34, 36, 38, 40, 42 of the drain ohmic contact 32. In an embodiment, the anneal may be performed at a temperature within a range of about 450° C. to about 650° C. In an embodiment, the anneal may be performed at a temperature of about 540° C. for a time of about ninety (90) seconds. In an embodiment, the anneal may be performed in an inert atmosphere, such as a nitrogen atmosphere.

The anneal may form a layer 46 adjacent to the channel layer 20, a layer 48, and a region 50 between the layer 46 and the layer 48. The layer 46 may be comprised of the material of layer 40 and, more specifically, the layer 46 may be comprised of aluminum originating from the layer 40. In an embodiment, the layer 40 does not include the material of the layer 34, the material of the layer 36, the material of the layer 38, or the material of the layer 42. In an embodiment, the layer 46 may be exclusively comprised of aluminum. In an embodiment, the layer 46 may exclusively contain polycrystalline grains of aluminum originating from the layer 40. In an embodiment, the layer 46 may be comprised of aluminum and only contain trace amounts of titanium and silicon originating from the layers 34, 36, the layer 38, and the layer 42.

The layer 48 may be comprised of the materials of layers 34, 36, 38, 40, and 42 and, more specifically, the layer 48 may be comprised of silicon originating from the layers 34, 36, aluminum originating from the layer 40, and titanium originating from the layer 38 and the layer 42. The layer 48 may include mixed phases containing polycrystalline grains that are comprised of aluminum, titanium, and silicon from the layers 34, 36, 38, 40, 42. In an embodiment, the layer 48 may include mixed phases containing polycrystalline grains that are comprised of aluminum, titanium, and silicon, as well as polycrystalline grains that are exclusively comprised of aluminum. The polycrystalline grains of different composition in the mixed phases may be distributed over the volume of the layer 48. In contrast to the layer 48, the layer 46 does not comprise mixed phases containing polycrystalline grains comprising aluminum, titanium, and silicon, but instead only includes polycrystalline grains comprising aluminum. Silicon atoms originally in the layer 34 and silicon atoms originally in the layer 36 may be dispersed within the polycrystalline grains that are comprised of aluminum, titanium, and silicon in the layer 48. The topmost layer 44 may be unaffected by the anneal.

The region 50 may be comprised of oxygen atoms originating from the layer 36. In an embodiment, the region 50 may be comprised of oxygen atoms originating from the layer 36 and aluminum atoms originating from the layer 40. In an embodiment, the region 50 may be considered to be located at an interface between the layer 46 and the layer 48. In an embodiment, the region 50 may be constituted by a continuous layer. In an embodiment, the region 50 may be constituted by a discontinuous layer with intermittent gaps.

In an embodiment, the region 50 may be free of silicon atoms. In an embodiment, the region 50 may have a thickness in a range of one (1) nanometer to two (2) nanometers. In an embodiment, the region 50 may have a thickness in a range of two (2) nanometers to five (5) nanometers. In an embodiment, the region 50 may have a thickness of less than five (5) nanometers.

The layer 46, which contains aluminum atoms and lacks oxygen atoms, titanium atoms, and silicon atoms, separates the region 50, which contains oxygen atoms, from the III-V compound semiconductor material of the channel layer 20. In an embodiment, the layer 46 may be in direct contact with the channel layer 20 at an interface 47 and the layer 46 may separate the region 50 from a contacted portion of the channel layer 20. In an alternative embodiment, the layer 46 may be separated from the channel layer 20 by a partial thickness of the donor layer 22 and the layer 46 may be disposed between the region 50 and the channel layer 20. Aluminum atoms originating from the layer 40 diffuse from the layer 40 into the space in the layer stack where the layers 34, 36 were located prior to the anneal and displace silicon atoms from the layers 34, 36. The portion of the layer 46 immediately adjacent to the interface 47 with the channel layer 20 is free of titanium atoms and silicon atoms. Titanium atoms and silicon atoms may be confined to the layer 48 that is separated from the layer 46 by the region 50 and that is also separated from the channel layer 20 by the layer 46 and the region 50.

In an alternative embodiment in which the layer 36 contains nitrogen atoms instead of oxygen atoms, the region 50 may be comprised of nitrogen atoms originating from the layer 36. In an alternative embodiment in which the layer 36 contains carbon atoms instead of oxygen atoms, the region 50 may be comprised of carbon atoms originating from the layer 36.

Middle-of-line processing and back-end-of-line processing follow, which includes formation of field plates, contacts, vias, and wiring for an interconnect structure coupled to the gate 28 and the ohmic contacts 30, 32 of the high-electron-mobility transistor.

The absence of silicon and titanium at the interface 47 within each of the ohmic contacts 30, 32 contrasts with conventional ohmic contacts in which silicon and titanium are present at the interface 47. The ohmic contacts 30, 32 may exhibit a reduced resistance in comparison with conventional ohmic contacts in which silicon and titanium are present at the interface 47. The sheet resistance for the two-dimensional electron gas may be unchanged by the modification of the ohmic contacts 30, 32.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a substrate;
a layer stack on the substrate, the layer stack including a plurality of semiconductor layers each comprising a compound semiconductor material; and
a device structure including a first ohmic contact, the first ohmic contact including a first metal layer in a contacting relationship with a first portion of at least one of the plurality of semiconductor layers of the layer stack and a first region comprising oxygen atoms, and the first metal layer positioned between the first region and the first portion of the at least one of the plurality of semiconductor layers of the layer stack.

2. The structure of claim 1 wherein the first region further comprises aluminum atoms.

3. The structure of claim 1 wherein the first metal layer comprises aluminum.

4. The structure of claim 1 wherein the first metal layer exclusively comprises aluminum.

5. The structure of claim 4 wherein the first metal layer is free of oxygen atoms.

6. The structure of claim 1 wherein the first portion of the at least one of the plurality of semiconductor layers of the layer stack comprises gallium nitride.

7. The structure of claim 1 wherein the first region is discontinuous.

8. The structure of claim 1 wherein the first region is continuous.

9. The structure of claim 1 wherein the first ohmic contact includes a second metal layer having a different composition from the first metal layer, and the first region is positioned between the first metal layer and the second metal layer.

10. The structure of claim 1 wherein the device structure includes a second ohmic contact, the second ohmic contact includes a second metal layer in a contacting relationship with a second portion of the at least one of the plurality of semiconductor layers of the layer stack and a second region comprising oxygen atoms, and the second metal layer is positioned between the second region and the second portion of the at least one of the plurality of semiconductor layers of the layer stack.

11. The structure of claim 10 wherein the device structure includes a gate laterally between the first ohmic contact and the second ohmic contact.

12. The structure of claim 11 wherein the gate is positioned on the layer stack.

13. The structure of claim 1 wherein the first metal layer fully separates the first region from the first portion of the at least one of the plurality of semiconductor layers of the layer stack.

14. A structure for forming an ohmic contact, the structure comprising:
a substrate;
a first layer stack on the substrate, the first layer stack including a plurality of semiconductor layers each comprising a compound semiconductor material; and
a second layer stack on the first layer stack, the second layer stack including a first layer comprising silicon and oxygen adjacent to the first layer stack.

15. The structure of claim 14 wherein the second layer stack includes a second layer comprising silicon between the first layer and the first layer stack.

16. The structure of claim 15 wherein the second layer lacks oxygen atoms.

17. The structure of claim 14 wherein the second layer stack includes a third layer on the first layer, a fourth layer on the third layer, and a fifth layer on the fourth layer, the third layer comprising a first metal, the fourth layer comprising a second metal, and the fifth layer comprising a third metal.

18. The structure of claim 17 wherein the first metal is titanium, the second metal is aluminum, and the third metal is titanium.

19. A method comprising:
forming a first layer stack on a substrate, wherein the first layer stack includes a plurality of semiconductor layers each comprising a compound semiconductor material; and
forming an ohmic contact of a device structure, wherein the ohmic contact includes a metal layer in a contacting relationship with a portion of at least one of the plurality of semiconductor layers of the first layer stack and a region comprising oxygen atoms, and the metal layer is positioned between the region and the portion of the at least one of the plurality of semiconductor layers of the first layer stack.

20. The method of claim 19 wherein forming the ohmic contact of the device structure comprises:
forming a first layer comprising silicon and a second layer comprising silicon dioxide on the first layer stack;
forming a second layer stack including a plurality of metal layers on the first layer and the second layer; and annealing the first layer, the second layer, and the plurality of metal layers to form the ohmic contact.

\* \* \* \* \*

UNITED STATES PATENT AND TRADEMARK OFFICE
CERTIFICATE OF CORRECTION

PATENT NO. : 12,154,961 B1
APPLICATION NO. : 18/742692
DATED : November 26, 2024
INVENTOR(S) : Samuel Troughton Page 1 of 1

It is certified that error appears in the above-identified patent and that said Letters Patent is hereby corrected as shown below:

In the Claims

Column 8, Claim 17, Lines 43-44 read:
"third layer comprising a first metal, the fourth layer comprising a second metal, and the fifth layer comprising a third"

It should read:
--third layer comprises a first metal, the fourth layer comprises a second metal, and the fifth layer comprises a third--

Signed and Sealed this
Second Day of September, 2025

Coke Morgan Stewart
*Acting Director of the United States Patent and Trademark Office*